United States Patent
Chen et al.

(10) Patent No.: US 9,916,904 B2
(45) Date of Patent: Mar. 13, 2018

(54) REDUCING LEAKAGE CURRENT IN A MEMORY DEVICE

(75) Inventors: Nan Chen, San Diego, CA (US);
Mehdi Hamidi Sani, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 773 days.

(21) Appl. No.: 12/364,105

(22) Filed: Feb. 2, 2009

(65) Prior Publication Data

US 2010/0195366 A1 Aug. 5, 2010

(51) Int. Cl.
| | | |
|---|---|---|
| G11C 7/12 | (2006.01) | |
| G11C 17/18 | (2006.01) | |
| G11C 5/14 | (2006.01) | |

(52) U.S. Cl.
CPC .............. G11C 17/18 (2013.01); G11C 5/147 (2013.01); G11C 7/12 (2013.01); G11C 5/14 (2013.01)

(58) Field of Classification Search
CPC .. G11C 5/14; G11C 5/147; G11C 7/12; G11C 17/18
USPC ..... 365/203 X, 226 X, 229 O, 203, 226, 229
See application file for complete search history.

(56) References Cited

U.S. PATENT DOCUMENTS

| | | | | | |
|---|---|---|---|---|---|
| 4,782,465 | A | * | 11/1988 | Uchida | ................. H01L 27/108 257/202 |
| 5,184,202 | A | * | 2/1993 | Uchida | ................. H01L 27/112 257/390 |
| 5,814,851 | A | * | 9/1998 | Suh | ......................... G11C 5/147 257/296 |
| 6,449,204 | B1 | * | 9/2002 | Arimoto et al. | .............. 365/203 |
| 6,549,450 | B1 | | 4/2003 | Hsu et al. | |
| 6,922,370 | B2 | * | 7/2005 | Deng et al. | .................... 365/226 |
| 6,925,025 | B2 | * | 8/2005 | Deng et al. | .................... 365/226 |
| 7,042,779 | B2 | * | 5/2006 | Dudeck et al. | ............... 365/203 |
| 7,057,952 | B1 | * | 6/2006 | Lee et al. | ...................... 365/203 |

(Continued)

FOREIGN PATENT DOCUMENTS

| | | |
|---|---|---|
| CN | 1825489 A | 8/2006 |
| DE | 10027097 A1 | 2/2001 |

(Continued)

OTHER PUBLICATIONS

International Search Report/Written Opinion—PCT/US10/022896—International Search Authority EPO—Apr. 27, 2010.

(Continued)

*Primary Examiner* — Vanthu Nguyen
(74) *Attorney, Agent, or Firm* — Muncy, Geissler, Olds & Lowe, P.C./Qualcomm

(57) ABSTRACT

Memory devices and methods of reducing leakage current therein are disclosed. The memory device includes a memory core array including a plurality of bitlines, and peripheral logic configured to interface with the memory core array. The memory device further includes a footswitch configured to isolate the peripheral logic from a ground voltage, and a headswitch configured to isolate a precharge current path from the plurality of bit lines of the memory core array. Leakage current within the memory device may be reduced via the isolation provided by the footswitch and the headswitch.

21 Claims, 5 Drawing Sheets

(56) References Cited

U.S. PATENT DOCUMENTS

| | | | |
|---|---|---|---|
| 7,248,522 B2 * | 7/2007 | Hardee | G11C 7/065 365/189.05 |
| 7,289,373 B1 | 10/2007 | Son et al. | |
| 7,345,936 B2 * | 3/2008 | Notani | 365/203 |
| 7,372,746 B2 | 5/2008 | Kim | |
| 7,492,648 B2 | 2/2009 | Sturm et al. | |
| 2007/0041257 A1 | 2/2007 | Kim | |
| 2007/0223302 A1 | 9/2007 | Sturm | |
| 2008/0285367 A1 * | 11/2008 | Jung et al. | 365/203 |

FOREIGN PATENT DOCUMENTS

| | | |
|---|---|---|
| JP | S61258395 A | 11/1986 |
| JP | S6218699 A | 1/1987 |
| JP | 6295581 A | 10/1994 |
| JP | H1116384 A | 1/1999 |
| JP | 11219589 A | 8/1999 |
| JP | 2000285676 A | 10/2000 |
| JP | 2002100190 A | 4/2002 |
| JP | 2004259362 A | 9/2004 |
| JP | 2004355760 A | 12/2004 |
| JP | 2005085454 A | 3/2005 |
| JP | 2007520024 A | 7/2007 |
| KR | 100546415 B1 | 1/2006 |
| WO | 2005073982 A1 | 8/2005 |

OTHER PUBLICATIONS

Taiwan Search Report—TW099103050—TIPO—dated Apr. 9, 2014.

European Search Report—EP17156313—Search Authority—The Hague—dated Jun. 21, 2017.

* cited by examiner

REDUCING LEAKAGE CURRENT IN A MEMORY DEVICE

FIELD OF DISCLOSURE

Embodiments relate to a memory systems. In particular embodiments relate to reducing leakage current in memory devices during a sleep mode.

BACKGROUND

Electronic devices incorporating integrated circuits, such as application specific integrated circuits (ASICs), often employ power saving techniques to reduce power consumption and thereby achieve extended battery life. Small, portable devices such as mobile telephones and personal digital assistants (PDAs), for example, typically incorporate circuitry for implementing inactive modes to limit power consumption by logic circuitry. Inactive modes may include stand-by, low power and sleep modes.

Power dissipation in digital circuits, and more specifically in Complementary Metal Oxide Semiconductor (CMOS) circuits, is approximately proportional to the square of the supply voltage. Therefore, an effective way to achieve low-power performance is to scale down the supply voltage. CMOS circuits on ASICs are capable of operating at significantly reduced power levels. In order to avoid increases in propagation delay, however, the threshold voltage of the CMOS devices also is reduced.

The reduction in threshold voltage generally causes an increase in stand-by current due to changes in the sub-threshold leakage current of Metal Oxide Semiconductor (MOS) devices. The leakage current that flows through an "off" transistor tends to increase exponentially as the threshold voltage of a device is reduced. Therefore, electronic devices such as mobile telephones and PDAs that remain in an inactive mode for an extended period of time can exhibit significant leakage current, and cause undesirable drain on battery power during the inactive mode.

In order to reduce leakage current during stand-by modes, some ASICs include headswitches or footswitches that are electrically connected between the low voltage threshold (LVT) logic gates of a CMOS circuit and the power rail or ground rail. A headswitch is a high voltage threshold (HVT) Positive Channel Metal Oxide Semiconductor transistor positioned between the local power mesh routing of an ASIC core or block and the top-level power mesh routing. A footswitch is an HVT NMOS transistor positioned between the local ground mesh routing and the top-level ground rail/mesh.

During an inactive mode, the headswitches or footswitches are turned off to disconnect the LVT logic gates from the power/ground supply and thereby "collapse" the power rail. Because the headswitch or footswitch has a high threshold voltage, the amount of leakage current drawn from the power supply by the headswitch or footswitch is substantially reduced relative to the leakage current that would otherwise flow through the LVT logic gates. During an active mode, the headswitches or footswitches are turned on to connect the power supply and ground to the LVT gates. Therefore, during an active mode, the LVT logic gates are powered by substantially the same voltage as if they were directly connected to the power supply and ground.

The implementation of headswitch or footswitch circuitry on a global basis to collapse the power rail for a large array of logic cells can be relatively complicated. Conventional approaches to headswitch/footswitch implementation have relied on special routing and custom analysis and design tools. Numerous issues, including extra power routing to feed the headswitches and footswitches, significant area overhead, unmanageable IR voltage drops, signal routing accommodations, complications to standard tool flow and methodology, and the use of feed-throughs, further compound the complexity of conventional headswitch and footswitch implementations.

SUMMARY

Embodiments are directed to current leakage reduction in memory devices during a sleep mode.

An embodiment can include a memory device, comprising: a memory core array including a plurality of bitlines; peripheral logic configured to interface with the memory core array; at least one footswitch configured to isolate the peripheral logic; and a headswitch configured to isolate a precharge current path from a supply voltage to the plurality of bit lines of the memory core array.

Another embodiment can include a method of reducing leakage current in a memory device, comprising: entering a sleep mode; isolating, with a footswitch, the peripheral logic from a ground voltage during the sleep mode; and isolating, with a headswitch, a precharge current path to a plurality of bitlines included within the memory core array during the sleep mode.

Another embodiment can include a memory device comprising: means for receiving a sleep mode signal to enter a sleep mode; means for isolating a peripheral logic from a ground voltage, the peripheral logic configured to interface with a memory core array during the sleep mode; and means for isolating a precharge current path from a plurality of bitlines included within the memory core array during the sleep mode.

Another embodiment can include a method of reducing leakage current in a memory device, the method comprising: step for entering a sleep mode; step for isolating, with a footswitch, the peripheral logic from a ground voltage during the sleep mode; and step for isolating, with a headswitch, a precharge current path to a plurality of bitlines included within the memory core array during the sleep mode.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1:
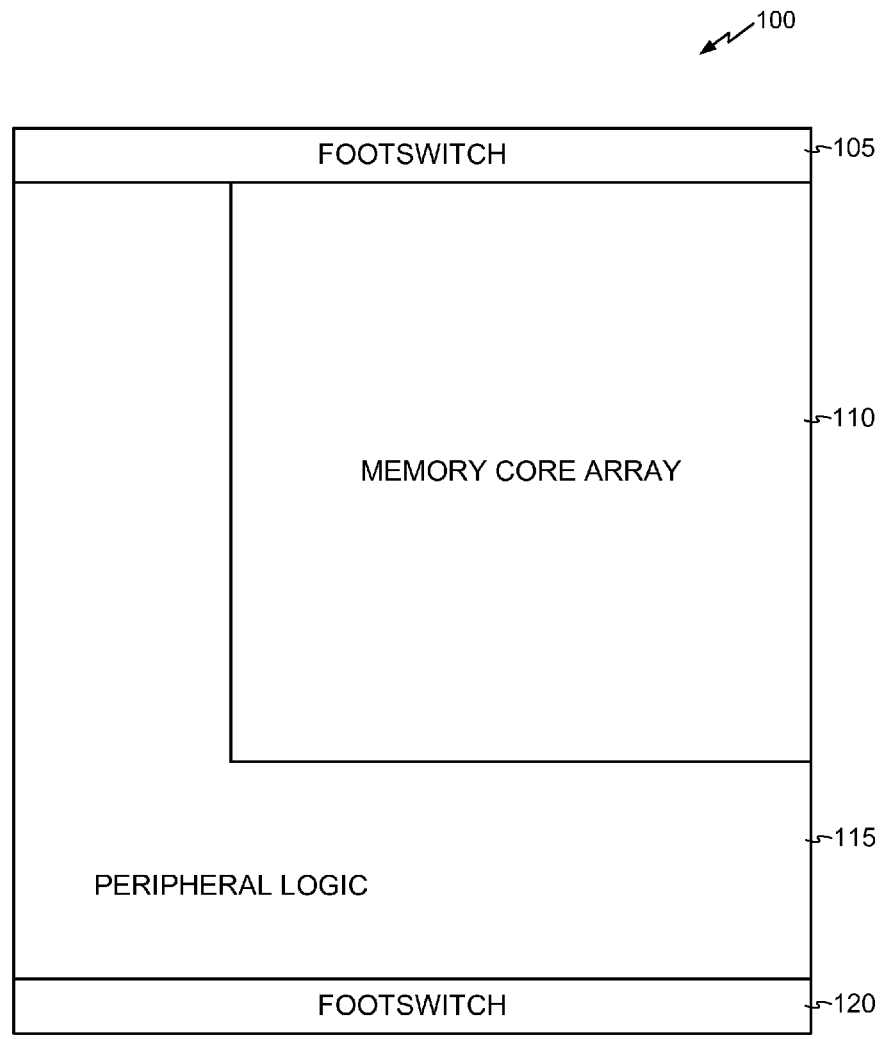
FIG. 1 illustrates a conventional read-only memory (ROM).

Aspects of the embodiments are disclosed in the following description and related drawings directed to specific embodiments. Alternate embodiments may be devised without departing from the scope of the embodiments. Additionally, well-known elements of the embodiments will not be described in detail or will be omitted so as not to obscure the relevant details of the embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Additionally as used herein a headswitch is a transistor positioned between the local high voltage source and system high voltage source (e.g. supply voltage/Vdd). A footswitch is a transistor positioned between the local ground or low voltage and the system ground or low voltage source (e.g., Vss).

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In order to better understand embodiments, two conventional memory devices will be describe. Further, for consistency and to facilitate and understanding specific examples of read-only-memory (ROM) will be described with respect to FIGS. 1 and 2, followed by a description of embodiments. However, it will be appreciated that embodiments are not limited to ROM devices. Embodiments can include any memory device that does not need power to maintain its memory state and has precharge transistors which can be configured as a headswitch as described herein.

FIG. 1 illustrates a conventional ROM 100. The ROM 100 of FIG. 1 includes footswitches 105 and 120, a memory core array 110 and peripheral logic 115. The peripheral logic 115 includes low voltage threshold transistors to facilitate higher performance of the ROM 100. By contrast, the footswitches 105 and 120 include high voltage threshold NMOS transistors.

Referring to FIG. 1, during operation of the ROM 100, a gate controlling the NMOS transistors of the footswitches 105 and 120 is set to a higher logic level (e.g., "1"), which transitions the NMOS transistors to an "on" state. During periods when the ROM 100 is not in operation, the gate controlling the NMOS transistors of the footswitches 105 and 120 transitions to a lower logic level (e.g., "0"). The NMOS transistors of the footswitches 105 and 120 thereby transition to an "off" state. Accordingly, leakage current is reduced during inactivity of the ROM 100 because current flow is restricted through the footswitches 105 and 120 while the ROM 100 is not operating (i.e., in "sleep" mode).

Figure 2:
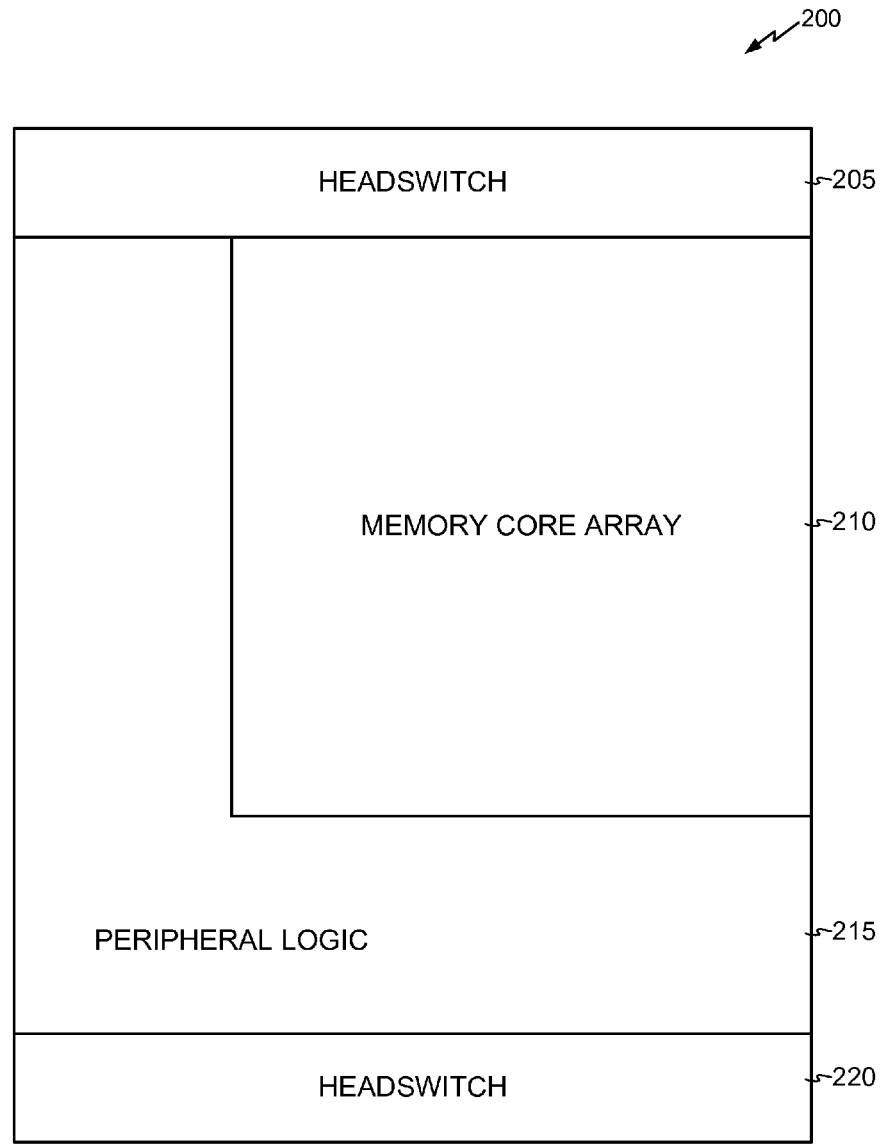
FIG. 2 illustrates another conventional ROM.

FIG. 2 illustrates another conventional ROM 200. The ROM 200 of FIG. 2 includes headswitches 205 and 220, a memory core array 210 and peripheral logic 215. The peripheral logic 215 includes low voltage threshold transistors to facilitate higher performance of the ROM 200. Unlike the footswitches 105 and 120 of FIG. 1, the headswitches 205 and 220 of FIG. 2 include high voltage threshold PMOS transistors.

Referring to FIG. 2, during operation of the ROM 200, a gate controlling the PMOS transistors of the headswitches 205 and 220 is set to a lower logic level (e.g., "0"), which transitions the PMOS transistors to an "on" state and couples the local power distribution to the system power distribution (e.g., supply voltage). During periods when the ROM 200 is not in operation, the gate controlling the PMOS transistors of the headswitches 205 and 220 transitions to a higher logic level (e.g., "1"). The PMOS transistors of the headswitches 205 and 220 thereby transition to an "off" state, which decouples the local power distribution. Accordingly, leakage current is reduced during inactivity of the ROM 200 because current is not permitted to flow through the headswitches 205 and 220 while the ROM 100 is not operating.

With regard to the footswitch-only approach of FIG. 1, reduction of leakage current is achieved at the expense of performance. The memory core 100 for the ROM 100 typically includes NMOS transistors, where the weakest NMOS transistors within the memory core 100 are more prone to process variations. Further, the power source of the memory core 100 is not connected to a true ground voltage. Accordingly, the footswitch-only approach of FIG. 1 incurs performance degradation and higher susceptibility to process variations.

Figure 3:
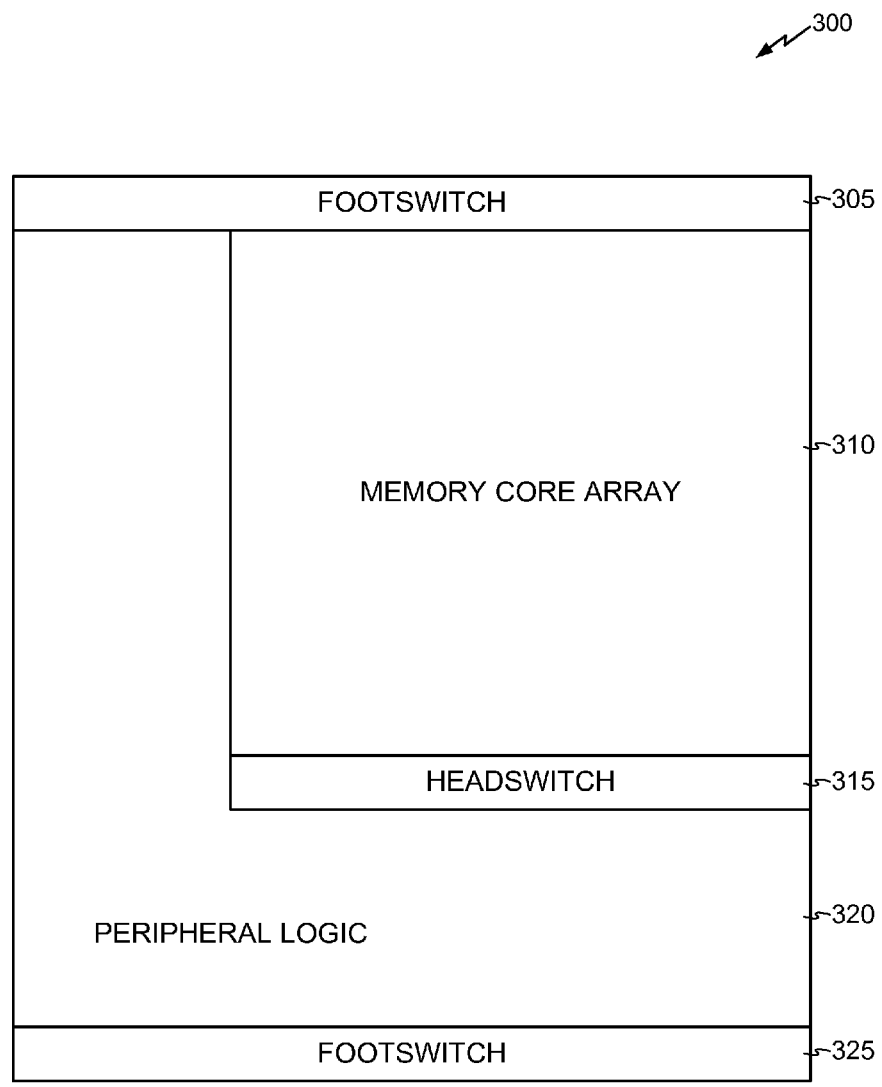
FIG. 3 illustrates a ROM.

With regard to the headswitch-only approach of FIG. 2, the headswitches 205 and 220 are typically embodied as PMOS transistors. The drain saturation current (Idsat) of a PMOS transistor is conventionally half that of an NMOS device of the same size. Accordingly, the PMOS transistors of the headswitch are approximately twice the size as a corresponding NMOS transistor in a footswitch. Thus, the headswitch-only approach of FIG. 2 is associated with a higher layout area of the ROM 200. Also, FIG. 3 illustrates a ROM 300 according to an embodiment. The ROM 300 of FIG. 3 includes footswitches 305 and 325, a memory core array 310, a headswitch 315 and peripheral logic 320. The peripheral logic 320 and core array 310 includes low voltage threshold transistors to facilitate higher performance of the ROM 300.

It will be appreciated that the illustration of FIG. 3 illustrating footswitches 305 and 325 represents a specific physical layout. However, embodiments are not limited to this configuration. For example, footswitches 305 and 325 may be electrically coupled and operate in cooperation. Further, a single footswitch or multiple footswitches may be used to couple and decouple a local/virtual ground (e.g., vir_vss) of the peripheral logic from a global or system ground (e.g. Vss or 0 voltage point). Still further a "footswitch", or "headswitch" as used herein may include one or more switching devices (e.g., transistors). However, for convenience of illustration, explanation and consistency with the conventional embodiments of FIG. 1 and FIG. 2, the footswitches will be referred to herein as illustrated in FIG. 3.

Referring to FIG. 3, the footswitches 305 and 325 are positioned in a manner similar to that of the footswitches 105 and 120, respectively, of FIG. 1. Accordingly, during operation of the ROM 300, a gate controlling the NMOS transistors (not illustrated) of the footswitches 305 and 325 is set to a higher logic level (e.g., "1"). This transitions the NMOS transistors to an "on" state and couples the local ground to the system ground. During periods when the ROM 300 is not in operation, the gate controlling the NMOS transistors of the footswitches 305 and 325 transitions to a lower logic level (e.g., "0"). The NMOS transistors of the footswitches 305 and 325 thereby transition to an "off" state, which decouples the local ground from the system ground. Accordingly, leakage current is reduced during inactivity of the ROM 300 because current flow through the footswitches 305 and 325 is inhibited (or eliminated) while the ROM 300 is not operating.

Likewise, during the operation of the ROM 300, a gate controlling the NMOS transistors of the footswitches 305 and 325 is set to a higher logic level (e.g., "1"), which transitions the NMOS transistors to an "on" state. Accordingly, the local or virtual ground (e.g. vir_vss) is coupled to the system ground and current flow is permitted through the footswitches 305 and 325 while the ROM 300 is not operating.

Referring to FIG. 3, unlike the ROM 100 of FIG. 1, the ROM 300 further includes headswitch 315 positioned between the memory core array 310 and the peripheral logic 320. In an example, to reduce an area occupied by the ROM 300, the headswitch 315 can be implemented by a precharge transistors that are conventionally in ROMs. The headswitch 315 can be used cut off or restrict a precharge PMOS path to bit-lines 0 . . . 8 (bit0-bit8) of the memory core array 310. The headswitch 315 thereby reduces the burden placed upon the footswitches 305 and 325, as compared to the footswitches 105 and 120 of FIG. 1, because less current flows from the memory core array 310 into the peripheral logic section 320.

Accordingly, because the headswitch 315 reduces the current in the above-noted manner in the core, the ROM 300 can be configured to include the footswitches 305 and 325 for peripheral logic leakage reduction, which are less effective than headswitches at blocking current flow but consume less physical area on a circuit layout. It will be appreciated that the ROM 300 occupies less area as compared to the dual-headswitch implementation of the ROM 200 in FIG. 2, as there is no substantial additional area used for headswitch 315, which uses the existing functional precharge transistors, as discussed below. Further, embodiments operate more effectively than the dual-footswitch implementation of the ROM 100 in FIG. 1, as the additional headswitch 315 provides for improved leakage isolation, as noted above.

Figure 4:
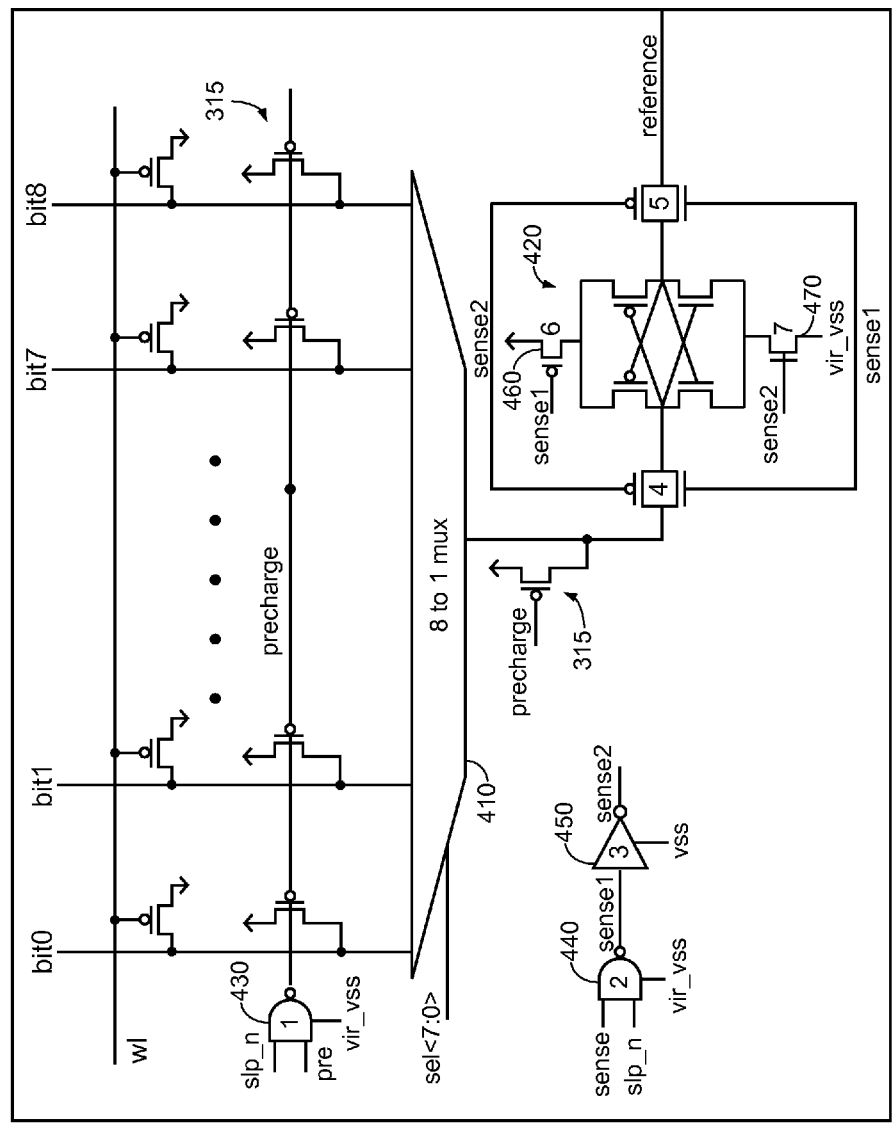
FIG. 4 illustrates a circuit diagram of the ROM of FIG. 3.

FIG. 4 illustrates a circuit diagram of the ROM 300 according to an embodiment. Referring to FIG. 4, a slp_n is an external sleep control signal (e.g., provided by a memory controller) that determines whether the ROM 300 is in an operating mode or a non-operating mode (i.e., sleep mode).

In an example, in the operating mode, the NMOS transistors of the footswitches 305 and 325 can be activated and the local ground (vir_vss) is pulled to the system ground level (e.g., "0") by the footswitches 305 and 325. Additionally, in the operating mode slp_n will be set to a high logic level.

During the operating mode in the precharge phase, precharge PMOS transistors of the headswitch 315 pull the bitlines 0 . . . 8 to the high logic level. Each of the select signal lines sel<7:0> of the 8:1 multiplexer 410 control can be set to a low logic level. The sense signal is set to the low logic level, thereby pre-charging the internal nodes 420 of the sense amplifier to the higher voltage level.

During the operating mode in the evaluation phase, the precharge PMOS transistors of the headswitch 315 are pulled to the higher logic level, a differential voltage is formed between the bitlines 0 . . . 8 and reference lines at the inputs of the sense amplifier 420. When the sense signal transitions to the higher logic level, the sense amplifier 420 senses the differential voltage and outputs an amplified version of the detected difference. The components (e.g., transmission gates 4 and 5) their functions and operations of the sense amplifier 420 are well known and will not be described further herein. Additionally, it will be appreciated that the precharge transistors of headswitch 315 are functionally operative during the operating mode and are devices which would be used in conventional designs. Accordingly, headswitch 315 can be formed of existing components that serve a dual function. By leveraging these existing components, the area, routing complexity and other negative design considerations of adding a conventional headswitch are mitigated by embodiments.

In an example, in sleep mode, the slp n signal can be set to the lower logic level (e.g., "0"). A NAND gate 430 (NAND1) pulls the precharge signal "precharge" to the higher logic level (e.g., "1") based on the states of inputs slp_n and precharge control signal pre, thereby turning off the PMOS field effect transistors (PFETs) which supply a power supply voltage Vdd to the bitlines 0 . . . 8. Thus, each of the bitlines 0 . . . 8 gradually transitions to a ground or low voltage level. As the NMOS transistors of the footswitches 305 and 325 are turned off, the internal nodes of the ROM 300 gradually transition to the higher logic level (e.g., the supply voltage Vdd, "1", etc.). Embodiments can include having the precharge transistor coupled to the sense amplifier 420 (via transmission gate 4) controlled by the same signal "precharge" as the precharge transistors coupled to bitlines 0 . . . 8. Accordingly, the precharge transistor coupled to the sense amplifier 420 can also form part of headswitch 315 in embodiments.

Further, in the sleep mode, a current path at the headswitch 315 and footswitches 305/325 can be reduced or eliminated, as will now be described. NAND gate 440 (NAND2) transitions the sense signal SENSE1 to the higher logic level, and outputs sense signal SENSE1. Inverter 450 (INV3), which includes a source connected to a system ground voltage (e.g., Vss), inverts the sense signal SENSE1, and outputs sense signal SENSE2 at the opposite logic level of SENSE1 (e.g. a low logic level). Coupling Inverter 450 to the system ground helps to ensure that a low logic level is reached. Accordingly, transistor 460 (PMOS6) and transistor 470 (NMOS7) in the sense amplifier 420 are shut off and the sense amplifier 420 is cutoff or isolated. The peripheral logic 320 is cutoff or isolated from the system ground voltage Vss by the footswitches 305/325, and the bitlines 0 . . . 8 are cutoff or isolated from the supply voltage Vdd by the precharge transistors which form headswitch 315. Thus, a relatively clean isolation using the headswitch 315 and footswitches 305/325 can be achieved.

As discussed above, the NMOS transistors of the bitcells 0 . . . 8 need not be footswitched in the ROM 300 of FIGS. 3 and 4. Rather, the headswitch 315 may be used, thereby reducing a performance degradation associated with the ROM 100 of FIG. 1. Also, the increased area associated with the headswitch implementation of the ROM 200 of FIG. 2 can be reduced or eliminated because footswitches are used (as in FIG. 1), and the additional headswitch 315 can be provided via precharge transistor which form part of the memory circuit design. Thus, the ROM 300 can achieve the performance of the ROM 200 with the area efficiency of the ROM 100.

Figure 5:
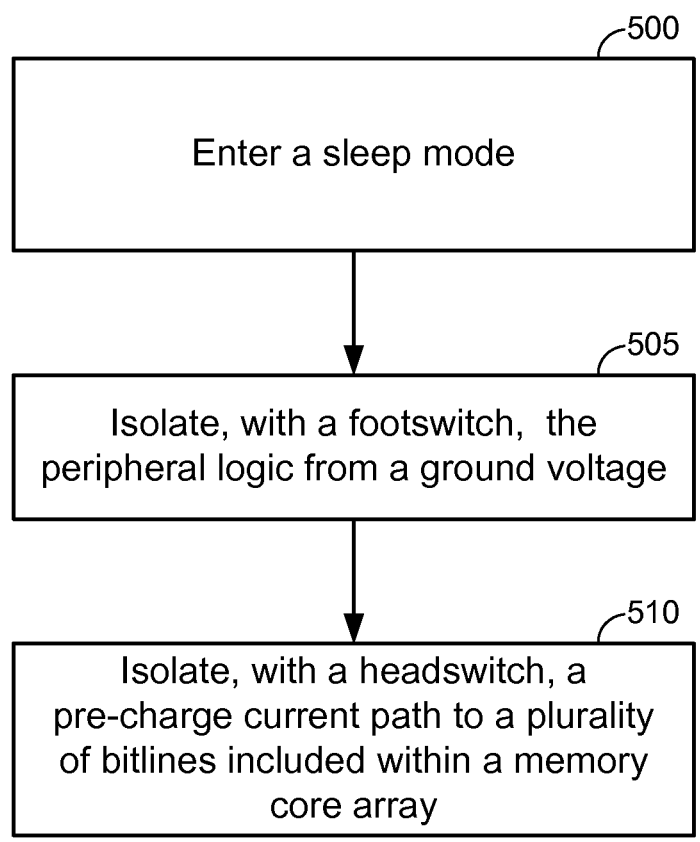
FIG. 5 illustrates a process for reducing leakage current in the ROM of FIGS. 3 and 4.

FIG. 5 illustrates a process for reducing leakage current in the ROM 100. In particular, FIG. 5 describes the functionality of the structure set forth above in FIGS. 3 and 4 in terms of a process (e.g., although the steps included in FIG. 5 need not be performed in the order indicated, but can rather be performed in any order). Accordingly, referring to FIG. 5, a sleep mode is entered in 500. The footswitches 305 and 325 isolates the peripheral logic 320 and the core 310 from the ground voltage Vss, 505. In 510, the headswitch 315 isolates the precharge current path (e.g., the precharge transistor as illustrated in FIG. 4) from a plurality of bitlines (e.g., bit0 through bit8) of the memory core array 310. Further, it will be appreciated that the functionality describe herein may be implemented at least in part on a logic/controller coupled to the memory (e.g., to generate the external signals discussed in the foregoing). Additionally, it will be appreciated that any process and functionalities described in herein may be included methods according to embodiments. Accordingly, the flowchart and related description is provided herein merely as an example embodiment.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In FIGS. 3 and 4, it will be appreciated that the ROM 300 may be included within a mobile phone, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments, it should be noted that various changes and modifications could be made herein without departing from the scope of the embodiments as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A memory device, comprising:
    a memory core array including a plurality of bitlines coupled to bit cells;
    peripheral logic configured to interface with the memory core array;
    at least one footswitch configured to isolate the peripheral logic;
    a headswitch configured to isolate a high voltage supply from the memory core array including the bit cells and a sense amplifier during a sleep mode, wherein the headswitch is formed of a plurality of precharge transistors each arranged in series with each of the bit cells coupled to corresponding bitlines and a precharge transistor coupled to the sense amplifier, and used as part of the memory core array;
a p-type metal oxide semiconductor (PMOS) transistor configured to isolate the high voltage supply from the sense amplifier during the sleep mode; and
an n-type metal oxide semiconductor (NMOS) transistor configured to isolate a low voltage supply from the sense amplifier during the sleep mode.

2. The memory device of claim 1, further comprising:
a first logic gate coupled to the plurality of precharge transistors, wherein the first logic gate is configured to receive a sleep mode signal and a precharge signal, and wherein the precharge transistor coupled to the sense amplifier is also configured to receive the precharge signal.

3. The memory device of claim 2, wherein the first logic gate is a NAND gate having an output coupled to gates of the plurality of precharge transistors.

4. The memory device of claim 2, further comprising:
a multiplexer configured to couple one of the plurality of bitlines to the sense amplifier.

5. The memory device of claim 4, further comprising:
a second logic gate coupled to a third logic gate, wherein the second logic gate is configured to receive the sleep mode signal and a sense signal and wherein the second logic gate and the third logic gate are configured to output a signal to isolate the sense amplifier during the sleep mode.

6. The memory device of claim 5, wherein the second logic gate is a NAND gate and the third logic gate is an inverter.

7. The memory device of claim 1, wherein the memory device is a read-only- memory (ROM).

8. The memory device of claim 1, further comprising an electronic device, selected from the group consisting of a set top box, music player, video player, entertainment unit, navigation device, communications device, personal digital assistant (PDA), fixed location data unit, and a computer, into which the memory device is integrated.

9. A method of reducing leakage current in a memory device comprising a memory core array and peripheral logic configured to interface with the memory core array, the method comprising:
entering a sleep mode;
isolating, with a footswitch, the peripheral logic from a ground voltage during the sleep mode;
isolating, with a headswitch, the memory core array including bit cells and a sense amplifier during the sleep mode, wherein the headswitch is formed of a plurality of precharge transistors each arranged in series with each of the bit cells coupled to corresponding bitlines and a precharge transistor coupled to the sense amplifier, and used as part of the memory core array;
isolating, with a p-type metal oxide semiconductor (PMOS) transistor, a high voltage supply from the sense amplifier; and
isolating, with an n-type metal oxide semiconductor (NMOS) transistor, a low voltage supply from the sense amplifier. the bit cells coupled to corresponding bitlines and a precharge transistor coupled to the sense amplifier, and used as part of the memory core array;
means for isolating a high voltage supply from the sense amplifier; and
means for isolating a low voltage supply from the sense amplifier.

10. The method claim 9, further comprising:
receiving a sleep mode signal at a first logic gate;
turning off the plurality of precharge transistors to isolate the bitlines from a precharge current path; and
turning off the precharge transistor coupled to the sense amplifier to isolate the sense amplifier from the precharge current path.

11. The method of claim 10, wherein the first logic gate is a NAND gate having an output coupled to gates of the plurality of precharge transistors.

12. The method of claim 10, further comprising:
receiving a sleep mode signal at a second logic gate;
outputting a first sense signal to a third logic gate;
outputting a second sense signal from the third logic gate, and
isolating the sense amplifier in response to the first and second sense signals during the sleep mode.

13. The method of claim 12, wherein the second logic gate is a NAND gate and the third logic gate is an inverter.

14. The method of claim 9, wherein the memory device is a read-only-memory (ROM).

15. A memory device comprising:
means for receiving a sleep mode signal to enter a sleep mode;
means for isolating a peripheral logic from a ground voltage, the peripheral logic configured to interface with a memory core array during the sleep mode;
means for isolating the memory core array including bit cells and a sense amplifier during the sleep mode comprising a plurality of precharge transistors each arranged in series with each of the bit cells coupled to corresponding bitlines and a precharge transistor coupled to the sense amplifier, and used as part of the memory core array;
means for isolating a high voltage supply from the sense amplifier; and
means for isolating a low voltage supply from the sense amplifier.

16. The memory device of claim 15, further comprising:
means for turning off the plurality of precharge transistors to isolate a plurality of bitlines from the precharge current path; and
turning off the precharge transistor coupled to the sense amplifier to isolate the sense amplifier from the precharge current path.

17. The memory device of claim 16, wherein the means for turning off the plurality of precharge transistors is a NAND gate having an output coupled to gates of the plurality of precharge transistors.

18. The memory device of claim 16, further comprising:
means for outputting a first sense signal;
means for outputting a second sense signal; and
means for isolating a sense amplifier in response to the first and second sense signals during the sleep mode.

19. The memory device of claim 18, wherein means for outputting the first sense signal is a NAND gate configured to receive the sleep mode signal and the means for outputting the second sense signal is an inverter configured to receive the first sense signal.

20. The memory device of claim 15, wherein the memory device is a read-only- memory (ROM).

21. The memory device of claim 15, further comprising an electronic device, selected from the group consisting of a set top box, music player, video player, entertainment unit, navigation device, communications device, personal digital assistant (PDA), fixed location data unit, and a computer, into which the memory device is integrated.

* * * * *